United States Patent [19]

Haushalter

[11] Patent Number: 4,617,204

[45] Date of Patent: Oct. 14, 1986

[54] CHEMICAL SYNTHESIS OF THIN FILMS AND SUPPORTED CRYSTALS BY OXIDATION OF ZINTL ANIONS

[75] Inventor: Robert C. Haushalter, Clarendon Hills, Ill.

[73] Assignee: The United States of America as represented by the United States Department of Energy, Washington, D.C.

[21] Appl. No.: 750,067

[22] Filed: Jun. 28, 1985

Related U.S. Application Data

[63] Continuation of Ser. No. 455,614, Jan. 4, 1983, abandoned.

[51] Int. Cl.$^4$ .................. C23C 18/28; C23C 18/16
[52] U.S. Cl. ................................ 427/304; 427/305; 427/306; 427/436; 427/437; 427/438; 427/405; 427/399; 427/400

[58] Field of Search ............... 427/443.1, 436, 437, 427/438, 399, 400, 405, 304–306

[56] References Cited

U.S. PATENT DOCUMENTS

| | | | |
|---|---|---|---|
| 2,421,079 | 5/1947 | Narcus | 427/304 |
| 4,151,311 | 4/1979 | Feldstein | 427/304 |
| 4,459,330 | 7/1984 | Krause | 427/443.1 |

Primary Examiner—John D. Smith
Attorney, Agent, or Firm—William Lohff; James W. Weinberger; Judson R. Hightower

[57] ABSTRACT

Processes for (1) depositing main group metals on inorganic and metallic substrates, (2) depositing transition metals on organic, inorganic and metallic substrates, and (3) depositing combinations of main group metals and transition metals on organic, inorganic and metallic substrates. The resulting products have useful electrical, optical and/or decorative properties.

12 Claims, No Drawings

CHEMICAL SYNTHESIS OF THIN FILMS AND SUPPORTED CRYSTALS BY OXIDATION OF ZINTL ANIONS

CONTRACTUAL ORIGIN OF THE INVENTION

The U.S. Government has rights in this invention pursuant to Contract No. W-31-109-ENG-38 between the U.S. Department of Energy and the University of Chicago representing Argonne National Laboratory.

This is a continuation of application Ser. No. 455,614, filed Jan. 4, 1983, now abandoned.

BACKGROUND OF THE INVENTION

This invention relates to electroless processes for depositing main group and transition metals and combinations thereof on a variety of substrates and more particularly to processes involving redox reactions in which the substrate is utilized as an oxidizing or reducing agent in the reaction. The invention further relates to metal deposits on substrates and more particularly to the resulting products from the inventive processes which have useful electrical, optical and/or decorative properties.

In copending application Ser. No. 420,054 entitled "Electroless Metal Plating of Plastics" filed 9/20/82, and issued as U.S. Pat. No. 4,459,330, a process is disclosed for depositing a main group metal on certain organic substrates by utilizing a metal salt of an alkali metal in a positive valence state and a main group metal in a negative valence state, the metal salt being in a solution of a nonaqueous polar solvent which preferably is an amine or ammonia. In the process, the organic substrate appears to be sensitized by the transfer of electrons from the main group metal and by the transfer of the alkali metal cations on or within the substrate. While the process is useful with certain organic substrates such as the aromatic polyimides, it does not appear to operate satisfactorily with all organic substrates.

Therefore one object of the invention is a process by which main group metals may be deposited on other substrates other than certain organic substrates. Another object is a process for depositing other metals on a variety of substrates. An additional object is a process for depositing combinations of main group metals and other metals on a variety of substrates.

Additional objects, advantages and novel features of the invention will be set forth in part in the description which follows, and in part will become apparent to those skilled in the art upon examination of the following or may be learned by practice of the invention.

SUMMARY OF THE INVENTION

Briefly, the invention is directed to processes for (1) depositing main group metals on inorganic and metallic substrates, (2) depositing transition metals on organic, inorganic and metallic substrates, and (3) depositing combinations of main group metals and transition metals on organic, inorganic and metallic substrates. Regarding the first process, I have found that inorganic substrates and metallic substrates may be sensitized by contact with an alkali metal salt of a main group metal and that the main group metal may be deposited on those substrates. I have further found that transition metals may be deposited on organic, inorganic and metallic substrates by first sensitizing the substrate with an alkali metal salt to provide a reduced substrate at a negatively charged state with retained alkali metal cations. The sensitized substrate is then contacted with a transition metal salt such as $Pd(NO_3)$ to deposit the transition metal. In addition, I have found that the substrate with the deposited main group metal remains sensitized for subsequent deposition with other metals. In particular, a transition metal may be deposited over a main group metal on the various substrates by contacting the modified substrate with a salt of the transition metal.

The resulting products provide surfaces useful for their electrical, optical and/or decorative properties. With inorganic substrates, semiconductors based on the inorganic substrate may be produced with metallic deposits extending across the granular boundaries to reduce the resistances associated with those boundaries. With metallic substrates, combinations of metals in separate layers may be produced which have useful electrical and other properties. With transition metals on organic substrates, a relatively pure deposit may be produced since the alkali metal cation is extracted from the substrate during the deposition. Combinations of main group metals and transition metals on each of the above substrates also provide useful products.

DETAILED DESCRIPTION OF THE PREFERRED EMBODIMENT

In the processes of the invention, each substrate is reduced in a redox reaction during treatment by a solution of an alkali metal salt of a main group metal. In the solution, the alkali metal is at a positive monovalent state. Suitably, the alkali metals are potassium, sodium or lithium, advantageously potassium and sodium, and preferably potassium. The main group metal is at a negative valence state and may be characterized as polyatomic. When the treatment includes the direct deposition of the main group metal, the main group metal is selected from those metals having a reducing power at least equal to tellurium. These metals include those of atomic number in the range of 32–83 in groups 4a–6a which are capable of forming Zintl ions and alkali metal salts soluble in nonaqueous polar solvents. Advantageously, these include Ge, Sn, Pb, As, Sb, Bi and Te with Sn, Pb and Sb being preferable. When the treatment is not intended to form a metal deposit directly, and only to sensitize the surface of the substrate, the main group metal in the salt preferably has a reducing power below tellurium, such as $K_4SnTe_4$.

Prior to contact with the substrate, the alkali metal salt is dissolved in a nonaqueous polar solvent to form a solution. When deposition of the main group metal is desired, organic amines and ammonia which are capable of dissolving the particular salts are suitable as solvents. In general, polyamines with 2–4 carbon atoms and particularly 2–3 carbons atoms such as ethylenediamine, isopropylenediamine, and isobutylenediamine provide useful solutions. Ethylenediamine is preferred. When reduction of the substrate is desired without metal deposition, the solvent may be a lower alkanol with 1–2 carbon atoms such as ethanol and methanol and particularly methanol.

In the deposition of the main group metals, the substrates of this invention include inorganic and metallic materials which provide the supporting structure or matrix. Suitably, the inorganics include graphite, $MoS_2$, $TiS_2$ and $HfTe_2$. One of the benefits achieved by the use of an inorganic such as $MoS_2$ with a metal deposit is that a material for battery use may be produced. By depositing metal across grain boundaries, the resistance of the inorganic composition is reduced thereby improving its usefulness in batteries.

Metallic substrates suitably include the transition metals of Groups 1b, 2b and 8 with atomic numbers of 26-30, 45-48 and 77-79 such as Pt, Au, Ni, Pd, Cd and Ir. Preferably, the substrate is composed of one or more heavier metals with atomic numbers of 45-48 and 77-79.

In forming deposits of main group metals on inorganic and metallic substrates which are reducible by treatment with Zintl ions (or polyatomic main group metal anions), the extent and location of the deposit is at least partially dependent on the particular substrate. For graphite single crystals, a solution of $K_4Sn_9$ in ethylenediamine forms deposits primarily on the edges of the crystal. This effect is believed to be due to the greater relative ease of the potassium cation intercalation between the layers in contrast to the crystal face. With inorganic metal substrates such as $TiS_2$, $MoS_2$ and $HfTe_2$, the anions of the main group metals generally react at different rates with the various crystal faces. With the more electronegative transition metals such as Pt, Au and the like, the main group metal anions react with the substrate to provide a metallic film on the substrate. The results with the inorganic and metallic substrates were somewhat surprising since it was unknown if these substrates could be sensitized by the alkali metal cation.

Usually, the process of the invention provide useful results at temperatures in the order of about $-40°$ to $100°$ C., advantageously about $0°-100°$ C., and preferably about $10°-50°$ C. Times of the treatment or reaction are generally in the order of a few seconds to 24 hours depending on the salt and substrate.

In the resultant product, the metal deposit is generally in granular form and provides an irregular surface of metal. Frequently, the deposit may be characterized as an island film of one or more film segments which cover less than the entire treated surface.

In forming deposits of transition metals on organic substrates (composed predominantly of a supporting organic matrix), the substrate (which is reducible by treatment with Zintl ions or polyatomic main group metal anions) is first reduced without metal deposition by treatment with an alkali metal salt of a main group metal where the main group metal has a reducing power below tellurium. Advantageously, the salt is $K_4SnTe_4$ and the treatment is carried out in a lower alkanol such as methanol for a time to reduce the substrate and transfer potassium cations to the substrate. The sensitized substrate is then treated with a solution of a transition metal salt which advantageously is a halide for a time sufficient to deposit the transition metal on the substrate. The plated substrate is removed from the solution and washed with additional methanol.

Suitably, the transition metal for deposition in the processes of this invention are those with atomic numbers of 26-30, 45-48, and 77-79 in Groups 1b, 2b and 8 of the Periodic Table such as Ni, Cu, Rh, Pd, Ag, Cd, Ir, Pt and Au. In general, the heavier metals with atomic numbers of 45-48 and 77-79 are preferred.

Suitable organic polymers as substrates include aromatic polyimides, polysulfones, styrene polymers with vinyl pyridine, substituted styrene polymers with electron withdrawing groups and polyacetylene. Advantageously, they have electron withdrawing groups in the polymeric backbone or as substituents on the aromatic groups. Carbonyl and sulfonyl groups are illustrative of electron withdrawing groups in the backbone while thiocyanide, cyanide, ester amide, carbonyl, and halogen groups are illustrative of electron withdrawing groups as substituents.

When a combination of main group and transition metals is desired, a substrate is first treated with an alkali metal salt of a main group metal as described above and then with a transition metal salt such as $AgNO_3$ or $Pb(NO_3)$ to replace the potassium cation in the plated substrate with the transition metal. The substrate suitably may be an organic, inorganic or metallic of the types described above.

The following examples are provided for illustrative purposes and are not intended to be restrictive as to scope of the invention:

EXAMPLES I-III $K_4Sn_9$, $K_4Pb_9$, $KBi_2$, $K_3Sb_7$, $K_3As_7$, and $K_2Te_3$, as alkali metal salts, were prepared by sealing stoichiometric amounts of the elements in evacuated quartz ampules. The ampules were heated rapidly to approximately $700°-800°$ C. (in a well ventilated environment) and held at that temperature for about 5-10 minutes followed by rapid cooling (about 5 min.) to room temperature. The cooled ampules were transferred to an argon filled glove box (having less than 1 ppm $O_2$) which was opened and the contents were ground to a fine powder. The salt of KGe was prepared in evacuated, electron beam welded Ta capsule (about 0.5 inch OD with 0.020 inch walls). The Ta capsule was then sealed in evacuated quartz jackets, heated to approximately $1000°$ C. for about two days and then quenched rapidly by immersion in water. Composition of the above salts were confirmed by powder X-ray diffraction.

Solutions of the salts were prepared in ethylenediamine which had been dried by stirring over calcium hydride for several days followed by distillation. Approximately 100-400 mg. of the salt was dissolved in about 10 ml. of the solvent.

Graphite, $HfTe_2$ and $MoS_2$ substrates were metallated by immersion in the solutions for times ranging from less than one hour to several days. For $K_4Sn_9$ with graphite, $HfTe_2$ and $MoS_2$, the time of immersion in $K_4Sn_9$ (approximately 20 mg/ml) was about 12 hours at $25°$ C. Analysis of the surfaces by scanning electron microscopy revealed the presence of tin crystallites on the substrates with the heaviest depositions on the edges of the crystals or parallel to the crystallographic ab plane. The presence of tin and potassium was confirmed by measurement of the element specific X-rays emitted under electron bombardment (energy dispersive spectroscopy).

EXAMPLES IV-IX

Solutions of $K_4Pb_9$ in ethylenediamine (mg/ml) were also used for immersing metallic substrates (Pt, Au, Ir, Pd, Ni and Cd). A deposition of lead was observed in the surface of each substrate confirmed by X-ray diffraction or energy dispersive spectroscopy. The presence of potassium was also observed. For the test with Pt as the substrate, a piece of Pt foil was polished with 325 mesh Carborundum, followed by rinses in concentrated hydrochloric acid and distilled water. The cleaned Pt was inserted into an argon filled glove box and immersed for about 48 hours in a solution of $K_4Pb_9$ in ethylenediamine (about 250 mg/ml) followed by rinsing with fresh ethylenediamine. Analysis of the surface by SEM and EDS revealed the surface to be covered by an island film of lead grains (from less than about 1 m–10 m) with the intergranular spaces containing high potassium concentrations.

EXAMPLE X

The salt $K_4SnTe_4$ was prepared by reacting the salt KSn with one equivalent of Te at 600°–650° C. for 10 minutes under argon in quartz. The alloy was inserted into an argon filled glove box and crushed and the plug of excess Sn removed.

The resulting dark solid was extracted with $O_2$ free water (4 ml $H_2O/g$) for 30 minutes with stirring. The solution was filtered and evaporated under vacuum. Trituration of the residue with $O_2$ free dimethylformamide, filtration and drying under vacuum produced essentially pure $K_4SnTe_4$.

Metallization of an aromatic polyimide film was than carried out using the $K_4SnTe_4$. The polyimide film (5 mil) was cut into small pieces and heated for 3 hours at 200° C. and transferred to an argon glove box while still hot. The polyimide was reduced by immersing it in 0.05–0.5M solutions of $K_4SnTe_4$ in methanol until the desired amount of reduction has occurred as evidenced by a change in color to green. The films were rinsed well in fresh methanol. The reduced polyimide was immersed in concentrated dimethylformamide solutions of platinum nitrate until the reaction was finished (which was associated with diffusion of reactants stopped by deposited metal film). The film was washed with dimethylformamide and then toluene.

EXAMPLES XI–XII

Depositions of two different metals were carried out on Pt foil. Immersion of Pt foil in a solution of $K_4Pb_9$ (150 mg $K_4Pb_9$/ml) for about 24 hours at 25° C. resulted in a granular deposit of Pb on a reduced K/Pt substrate. After rinsing in ethylenediamine and drying, the Pb/K/Pt surface was immersed in a saturated solution of $AgNO_3$ in dimethylformamide (DMF) for about one minute. The surface instantly darkened as Ag was deposited. Analysis of the surface by SEM and EDS confirmed the presence of Ag crystallites, as well as Pb, on the surface.

A similar sequence of reactions were performed to produce bimetallic surfaces on organic polymers. Treatment of a polyacetylene film with solutions of $K_4Sn_9$ in ethylene diamine (25–50 mg $K_4Sn_9$/ml) for about 5 minutes at 25° C. resulted in a granular deposit of Sn on the reduced polyacetylene. Immersion of the material in solutions of $Pb(NO_3)$ in DMF (20 mg Pd $(NO_3)_2$ ml DMF) provided metallic Pd on the Sn as identified by SEM and EDS.

Accordingly, the invention provides useful processes for (1) depositing main group metals on inorganic and metallic substrates, (2) depositing transition metals on organic, inorganic and metallic substrates, and (3) depositing combinations of main group metals and transition metals inorganic, inorganic and metallic substrates. The invention further provides products from these processes which have useful electrical, optical and/or decorative properties.

The embodiments of the invention in which an exclusive property or privilege is claimed are defined as follows:

1. A process for sensitizing a surface of a substrate comprising the steps of
    selecting an organic, inorganic or metallic substrate composed predominantly of a supporting matrix reducibly by a polyatomic main group metal anion in a redox reaction by the transfer of electrons to the substrate,
    forming a solution of a salt composed of alkali metal cations and polyatomic main group metal anions,
    treating said surface with said solution to oxidize the main group metal anions, to reduce the substrate by the transfer of electrons thereto and the formation thereby of a negatively charged matrix, to transfer the alkali metal cations to the substrate, and to deposit the main group metal on the surface of the substrate to form a modified surface of the substrate, and
    treating the modified surface with a solution of a salt of a transition metal cation to extract at least a portion of the alkali metal cations from the substrate and deposit the transition metal in elemental form on the modified surface.

2. The process of claim 1 wherein the substrate is organic.

3. The process of claim 1 wherein the substrate is inorganic.

4. The process of claim 1 wherein the substrate is metallic.

5. The process of claim 1 wherein the treating step with the alkali metal salt is carried out in an inert atmosphere, at a temperature in the range of about −40° C. to 100° C., and for a time sufficient to form the deposit.

6. The process of claim 5 wherein the heating step with the transition metal salt is carried out at a temperature in the range of about 10°–50° C. and for a time to transfer metal to the modified surface.

7. The process of claim 6 wherein the main group metals have an atomic number in the range of 32–83 and are in groups 4a–6a of the Periodic Table and the transition metals are those with atomic numbers of about 26–79 in groups 1b, 2b and 8 of the Periodic Table.

8. A process for sensitizing a surface of a substrate comprising the steps of
    selecting an organic, inorganic or metallic substrate composed predominantly of a supporting matrix reducible by a polyatomic main group metal anion in a redox reaction by the transfer of electrons to the substrate,
    forming a solution of a salt composed of alkali metal cations and polyatomic main group metal anions, the anions being capable of being oxidized to a lower valence state and remain in solution, and the main group metal having a reducing power below about that of tellurium,
    treating said surface with said solution to oxidize the metal anions to said lower valence state, reduce the substrate, by the transfer of electrons thereto and formation thereby of a negatively charged matrix, and transfer alkali metal cations to the substrate, to form a modified surface without the deposition of the main group metal,
    treating said modified surface with a salt of transition metal capable of forming a salt with the alkali metal cations to extract at least a portion of the alkali metal cations from the substrate and deposit the transition metal on the surface.

9. The process of claim 8 wherein the substrate is organic.

10. The process of claim 8 wherein the substrate is inorganic.

11. The process of claim 8 wherein the substrate is metallic.

12. The process of claim 8 wherein the transition metal salt is a halide salt.

* * * * *